United States Patent
Chow et al.

(10) Patent No.: US 10,390,455 B2
(45) Date of Patent: Aug. 20, 2019

(54) THERMAL ISOLATION OF CRYO-COOLED COMPONENTS FROM CIRCUIT BOARDS OR OTHER STRUCTURES

(71) Applicant: Raytheon Company, Waltham, MA (US)

(72) Inventors: James R. Chow, San Gabriel, CA (US); Theodore J. Conrad, Redondo Beach, CA (US); Stephanie Lin, Redondo Beach, CA (US); Richard C. Ross, Westlake Village, CA (US); Reza Tayrani, Redondo Beach, CA (US)

(73) Assignee: Raytheon Company, Waltham, MA (US)

( * ) Notice: Subject to any disclaimer, the term of this patent is extended or adjusted under 35 U.S.C. 154(b) by 0 days.

(21) Appl. No.: 15/470,315

(22) Filed: Mar. 27, 2017

(65) Prior Publication Data
US 2018/0279503 A1    Sep. 27, 2018

(51) Int. Cl.
*H05K 7/20*    (2006.01)

(52) U.S. Cl.
CPC ..... *H05K 7/20154* (2013.01); *H05K 7/20209* (2013.01); *H05K 7/20372* (2013.01)

(58) Field of Classification Search
CPC .... H05K 1/0203; H05K 1/0272; H05K 1/182; H05K 2201/064; H05K 1/184; H05K 5/0213; H05K 5/0247; H05K 5/0056; H05K 2201/09036; H05K 7/20372; H05K 7/20209; H05K 7/20154; H01L 23/46; H01L 23/467; H01L 23/473; H01L 23/42; H01L 23/4389; H01L 23/5389
(Continued)

(56) References Cited

U.S. PATENT DOCUMENTS 4,392,362 A    7/1983   Little
4,425,764 A    1/1984   Lam
(Continued)

FOREIGN PATENT DOCUMENTS

EP    1734800 A2    12/2006

OTHER PUBLICATIONS

Bradley, P., et al., "Development of a Mixed-Refrigerant Joule-Thomson Microcryocooler," Croyocoolers '15, International Cryocooler Conference, Inc. Boulder, CO., 2009, pp. 425-432.
(Continued)

*Primary Examiner* — Roshn K Varghese (57) ABSTRACT

An apparatus includes a substrate having a recess and a first insulator submerged in the recess of the substrate. The apparatus also includes a cover having a second insulator that, together with the first insulator, defines an insulated volume. The apparatus further includes one or more components to be cooled located over the first insulator and within the insulated volume. The apparatus could also include one or more electrical conductors located over the first insulator, where at least one of the one or more components is electrically connected to the one or more electrical conductors. The one or more electrical conductors could be submerged in the recess of the substrate. The one or more electrical conductors could be thermally-insulative at cryogenic temperatures and could include carbon nanotubes. The first and second insulators could include foam or aerogel insulation.

20 Claims, 5 Drawing Sheets

(58) Field of Classification Search
USPC .......................... 361/274.2, 679.53; 174/556
See application file for complete search history.

(56) References Cited

U.S. PATENT DOCUMENTS

| | | | | |
|---|---|---|---|---|
| 4,751,482 A * | 6/1988 | Fukuta | ................. | H01L 23/498 |
| | | | | 174/538 |
| 4,865,331 A | 9/1989 | Porter | | |
| 4,866,570 A | 9/1989 | Porter | | |
| 4,888,663 A * | 12/1989 | Longerich | .............. | G02B 6/001 |
| | | | | 174/17 SF |
| 4,912,548 A * | 3/1990 | Shanker | ................ | H01L 23/427 |
| | | | | 257/715 |
| 4,951,471 A | 8/1990 | Sakitani et al. | | |
| 5,040,053 A | 8/1991 | Porter et al. | | |
| 5,142,443 A | 8/1992 | Moore, Jr. | | |
| 5,212,626 A | 5/1993 | Bell et al. | | |
| 5,251,095 A | 10/1993 | Miller et al. | | |
| 5,373,417 A * | 12/1994 | Barrett | ..................... | H01L 23/42 |
| | | | | 361/699 |
| 5,380,956 A * | 1/1995 | Loo | ....................... | H01L 23/473 |
| | | | | 174/17 CT |
| 5,405,808 A * | 4/1995 | Rostoker | ................. | H01L 23/20 |
| | | | | 29/841 |
| 5,578,869 A * | 11/1996 | Hoffman | ............... | H01L 23/057 |
| | | | | 257/691 |
| 5,646,827 A * | 7/1997 | Hirao | ................ | H01L 23/49811 |
| | | | | 361/752 |
| 5,718,117 A * | 2/1998 | McDunn | ................. | F28F 13/02 |
| | | | | 361/699 |
| 5,775,109 A | 7/1998 | Eacobacci, Jr. et al. | | |
| 5,794,450 A | 8/1998 | Alexander | | |
| 5,870,823 A * | 2/1999 | Bezama | ................ | H01L 23/473 |
| | | | | 174/15.1 |
| 6,243,268 B1 | 6/2001 | Kang et al. | | |
| 6,272,866 B1 | 8/2001 | Tsai et al. | | |
| 6,301,097 B1 * | 10/2001 | Ellsworth, Jr. | ....... | H01L 23/473 |
| | | | | 174/17.05 |
| 6,324,067 B1 * | 11/2001 | Nishiyama | ............. | H05K 1/165 |
| | | | | 174/262 |
| 6,366,462 B1 * | 4/2002 | Chu | ...................... | H01L 23/427 |
| | | | | 361/699 |
| 6,655,154 B2 | 12/2003 | Funayama et al. | | |
| 7,215,547 B2 * | 5/2007 | Chang | ................. | H05K 1/0272 |
| | | | | 174/15.1 |
| 7,504,710 B2 * | 3/2009 | Suzuki | .................... | H01L 23/04 |
| | | | | 257/659 |
| 8,574,965 B2 * | 11/2013 | Refai-Ahmed | ......... | H01L 21/54 |
| | | | | 257/E21.499 |
| 8,934,250 B2 * | 1/2015 | Campbell | .......... | H05K 7/20236 |
| | | | | 361/699 |
| 2003/0047685 A1 | 3/2003 | Sobel et al. | | |
| 2004/0163797 A1 | 8/2004 | Cosley et al. | | |
| 2005/0047090 A1 * | 3/2005 | Tonosaki | ............ | F28D 15/0266 |
| | | | | 361/700 |
| 2005/0143515 A1 * | 6/2005 | Ristic-Lehmann | ......................... A41D 19/01529 |
| | | | | 174/255 |
| 2006/0050483 A1 * | 3/2006 | Wilson | .................. | H01L 23/473 |
| | | | | 361/702 |
| 2011/0134610 A1 * | 6/2011 | Baur | ..................... | H01L 23/473 |
| | | | | 361/720 |
| 2014/0022733 A1 * | 1/2014 | Lim | ..................... | H05K 7/2039 |
| | | | | 361/718 |
| 2016/0040830 A1 | 2/2016 | Chow et al. | | |

OTHER PUBLICATIONS

"DARPA Funds Low Power Micro Cryogenic Collers Program," Superconductor Week, http://www.superconductorweek.com/free-content/darpa-funds-c, 2013, 3 pages.

Doty, F., et al., "Development of 1-10W, 10 K Reverse Brayton Cycle Cryocoolers," Phase II Final Report, DOE Grant # DE FG02-98ER82565, Topic Area: Safeguards, Security, and Material Accountability for SNM, Mar. 21, 2003, 49 pages.

Feller, J., et al., "Distributed Cooling Techniques for Cryogenic Boil-Off Reduction Systems," Cryocoolers '15, International Cryocooler Conference, Inc. Boulder, CO., 2009, pp. 631-635.

Lewis, R., et al., "Micro Cryogenic Coolers for IR Imaging," Proceedings of the SPIE, vol. 8012 80122H-1, Oct. 11, 2011, 9 pages.

Lin, M., et al., "Design, Fabrication, and Assembly of a Hollow-Core Fiber-Based Micro Cryogenic Cooler," Transducers 2009, T3P.059, Denver, CO., Jun. 21-25, 2009 pp. 1114-1117.

Radebaugh, R., et al., "Design and Analysis of a 150 k Cascade Joule-Thomson Microcooler," Cryocoolers '18, International Cryocoolers Conference, Inc., Boulder, CO., 2014, pp. 377-388.

International Search Report and Written Opinion of the International Searching Authority in counterpart PCT Patent Application No. PCT/US2017/068254 dated Apr. 23, 2018, 17 pages.

* cited by examiner

THERMAL ISOLATION OF CRYO-COOLED COMPONENTS FROM CIRCUIT BOARDS OR OTHER STRUCTURES

TECHNICAL FIELD

This disclosure is generally directed to cryogenic cooling systems. More specifically, this disclosure is directed to thermal isolation of cryo-cooled components from circuit boards or other structures.

BACKGROUND

Improved performance can often be achieved in various electronic devices simply by cooling existing integrated circuit chips or modules. Greater enhancements have been demonstrated by incorporating superconducting materials that operate at cryogenic temperatures into circuit layouts. Obviously, such an approach requires cooling to very low (cryogenic) temperatures in order to use the superconducting materials effectively.

One typical cooling approach involves placing a circuit board in a vacuum enclosure called a dewar and then cooling the interior of the dewar to a cryogenic temperature. This approach helps to minimize external heat flow to the circuit board. This approach works for a single circuit board or a few circuit boards, and the increase in size and weight associated with the use of the dewar may be acceptable in certain applications. However, this approach generally cannot be used in various real-world applications, such as those with large arrays of circuit boards. In large arrays, the use of a single large dewar encapsulating the entire array or the use of smaller dewars encapsulating portions of the array dramatically increases the size, weight, and power (SWaP) requirements of the overall system, possibly beyond the available resources provided by a platform.

SUMMARY

This disclosure provides thermal isolation of cryo-cooled components from circuit boards or other structures.

In a first embodiment, an apparatus includes a substrate having a recess and a first insulator submerged in the recess of the substrate. The apparatus also includes a cover having a second insulator that, together with the first insulator, defines an insulated volume. The apparatus further includes one or more components to be cooled located over the first insulator and within the insulated volume.

In a second embodiment, a system includes a cryocooler. The system also includes an apparatus that includes a substrate having a recess and a first insulator submerged in the recess of the substrate. The apparatus also includes a cover having a second insulator that, together with the first insulator, defines an insulated volume. The apparatus further includes one or more components to be cooled by the cryocooler. The one or more components are located over the first insulator and within the insulated volume.

In a third embodiment, a method includes obtaining a substrate having a recess and a first insulator submerged in the recess of the substrate. The method also includes placing one or more components to be cooled over the first insulator. The method further includes placing a cover having a second insulator over the one or more components. The second insulator together with the first insulator defines an insulated volume in which the one or more components are located.

Other technical features may be readily apparent to one skilled in the art from the following figures, descriptions, and claims.

BRIEF DESCRIPTION OF THE DRAWINGS

For a more complete understanding of this disclosure, reference is now made to the following description, taken in conjunction with the accompanying drawings, in which.

DETAILED DESCRIPTION

FIGS. 1 through 5, described below, and the various embodiments used to describe the principles of the present invention in this patent document are by way of illustration only and should not be construed in any way to limit the scope of the invention. Those skilled in the art will understand that the principles of the present invention may be implemented in any type of suitably arranged device or system.

As noted above, cooling certain integrated circuit chips or modules (including those having superconducting materials) to very low or cryogenic temperatures can help improve the performance of those integrated circuit chips or modules. As a specific example, cryo-cooled analog-to-digital converters can be used to achieve higher bit-rate conversions and higher bit resolutions. This cooling is typically achieved by placing a circuit board into a dewar (which is often a large device) and cooling the interior of the dewar to a cryogenic temperature. However, the use of a dewar and other thermal, mechanical, and electrical super-structures increases the volume and weight of the overall system significantly. Also, the use of multiple dewars with highly-repetitive circuit structures (such as those found in many antenna arrays) could cause the overall structure to grow unacceptably large, possibly to the point where it cannot be supported by a platform.

In accordance with one aspect of this disclosure, techniques are provided for cooling integrated circuit chips or modules to low (possibly cryogenic) temperatures individually or in groups without the use of a dewar. A thermal insulative layer and electrical conductors (such as carbon nanotubes) are recessed in a circuit board or other structure, and at least one integrated circuit chip or module is placed over the thermal insulative layer and the electrical conductors. An insulative cover is placed over the integrated circuit chip or module, thereby encasing the integrated circuit chip or module in a volume that can be efficiently cooled. The electrical conductors can be used to electrically couple the integrated circuit chip or module to other circuit components.

In accordance with another aspect of this disclosure, techniques are provided for cooling electronic components using a distributed cryocooler architecture. The distributed cryocooler architecture includes a network of smaller (micro-scale) cryogenic expanders driven by a single larger (macro-scale) compressor. Each expander can be used to cool a single electronic component or a small group of electronic components.

Figure 1:
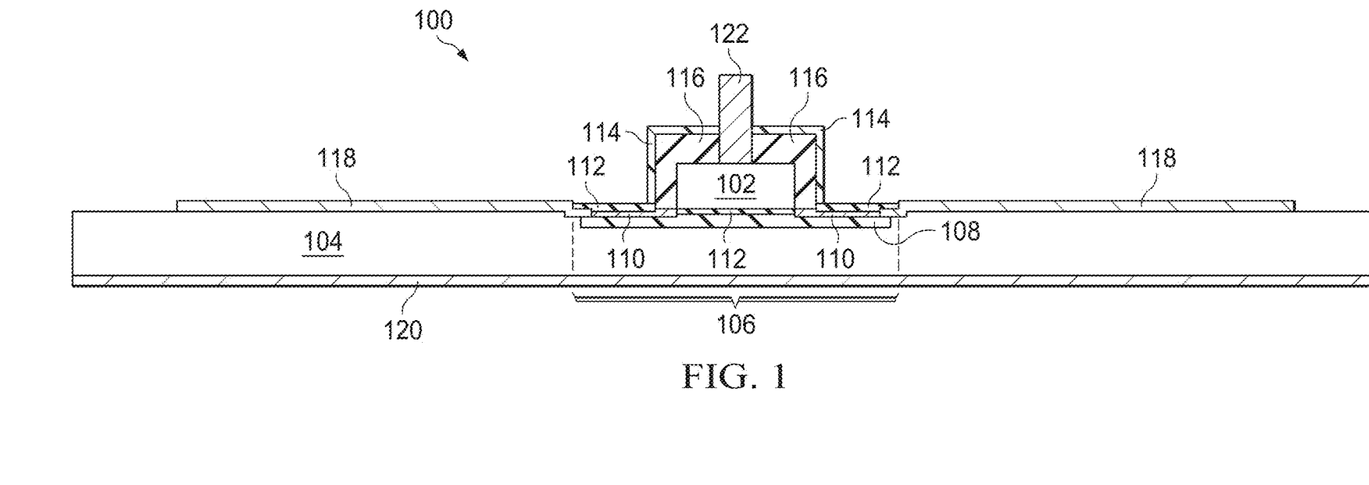
FIG. 1 illustrates an example arrangement for thermally isolating one or more cryo-cooled components from a circuit board or other structure according to this disclosure.

FIG. 1 illustrates an example arrangement 100 for thermally isolating one or more cryo-cooled components from a circuit board or other structure according to this disclosure. In the following example, the arrangement 100 is described as being used to thermally isolate a single integrated circuit chip 102. However, the same or similar approach could be used to thermally isolate multiple integrated circuit chips or one or more other electronic components (such as one or more integrated circuit modules).

The integrated circuit chip 102 denotes an integrated circuit that is to be cooled to a lower (possibly cryogenic) temperature. For example, the integrated circuit chip 102 could denote an integrated circuit that achieves improved performance when cooled. The integrated circuit chip 102 could also denote an integrated circuit that incorporates at least one superconducting material and that needs a lower (possibly cryogenic) temperature to operate as desired. The integrated circuit chip 102 includes any suitable integrated circuitry that is to be cooled.

As shown in FIG. 1, the arrangement 100 includes a substrate 104 having a recess 106. The substrate 104 generally includes any suitable structure on or in which circuit components (including the integrated circuit chip 102) or other components to be cooled can be placed or fabricated. For example, the substrate 104 could denote a generally flat carrier for circuit components. The substrate 104 could be formed from any suitable material(s) and in any suitable matter. As a particular example, the substrate 104 could be formed from a polymer.

The recess 106 denotes an open area of the substrate 104 where a portion of the substrate 104 has been removed or has not been formed. The recess 106 could be formed in the substrate 104 in any suitable manner, such as by removing a portion of the material forming the substrate 104 or by not placing material in that area during formation of the substrate 104. The recess 106 could have any suitable size, shape, and dimensions, which could depend (among other things) on the integrated circuit chip 102 or other component(s) to be cooled.

Within the recess 106 are an insulative layer 108, one or more thermally-insulative and conductive electrical conductors 110, and a dielectric layer 112. The insulative layer 108 denotes a layer of material that is thermally insulative and located under the integrated circuit chip 102 or other component(s) to be cooled. The insulative layer 108 could be formed from any suitable material(s) and in any suitable manner. As a particular example, the insulative layer 108 could be formed using a foam or aerogel insulation, such as an insulation from ASPEN AEROGELS. Because the insulative layer 108 is located within the recess 106, the insulative layer 108 may be referred to as a "submerged" insulative layer.

The one or more electrical conductors 110 provide one or more electrical connections to the integrated circuit chip 102 or other component(s) to be cooled. Because the electrical conductors 110 are thermally insulative, the electrical conductors 110 may not provide a path through which a significant amount of heat can leak toward the integrated circuit chip 102 or other component(s) to be cooled during operation. Each electrical conductor 110 includes any suitable structure providing an electrical connection with limited thermal transfer. In some embodiments, each electrical conductor 110 could be formed using strips of carbon nanotubes. As a particular example, each strip of carbon nanotubes could have ends that are plated with copper or other metal(s) or conductive material(s) that can be soldered or otherwise electrically coupled to other components in FIG. 1. Because the electrical conductors 110 are located within the recess 106, the electrical conductors 110 may be referred to as "submerged" conductors. Note, however, that the electrical conductors 110 need not be submerged as shown in the figure.

The dielectric layer 112 denotes a layer of dielectric material over the insulative layer 108 and the electrical conductors 110. The dielectric layer 112 helps to electrically isolate the integrated circuit chip 102, except for the electrical connection(s) formed to the integrated circuit chip 102 by the electrical conductor(s) 110. The dielectric layer 112 can also provide a seal to protect the underlying electrical conductors 110. The dielectric layer 112 could be formed from any suitable material(s) and in any suitable manner. As a particular example, the dielectric layer 112 could be formed from silicon dioxide ($SiO_2$), silicon nitride ($Si_3N_4$), or other oxide or nitride material.

A cover 114 having an insulative layer 116 is placed over the integrated circuit chip 102 or other component(s) to be cooled. The cover 114 encases the integrated circuit chip 102 or other component(s) to be cooled in a volume defined between the cover 114 and the underlying structure(s). The cover 114 could have any suitable size, shape, and dimensions, which could depend (among other things) on the integrated circuit chip 102 or other component(s) to be cooled. The cover 114 could also be attached to the underlying structure(s) in any suitable manner. For instance, the material(s) forming the substrate 104 or the dielectric layer 112 could be selected to provide a good planar thermal sealing surface around the integrated circuit chip 102 for the cover 114.

The insulative layer 116 denotes a layer of material that is thermally insulative and located over and around the integrated circuit chip 102 or other component(s) to be cooled. The insulative layer 116 could be formed from any suitable material(s) and in any suitable manner. As a particular example, the insulative layer 116 could be formed using a foam or aerogel insulation, such as an insulation from ASPEN AEROGELS. Collectively, the insulative layers 108 and 116 surround substantially all of the integrated circuit chip 102 or other component(s) to be cooled. This helps to provide a highly effective insulation around the component(s) to be cooled in order to significantly reduce parasitic heat flux.

One or more conductive traces 118 provide electrical connection between the integrated circuit chip 102 or other component(s) to be cooled and one or more other circuit components. The conductive traces 118 are electrically connected to the electrical conductors 110. As shown in FIG. 1, the electrical conductors 110 extend under the cover 114 while the conductive traces 118 do not, so the conductive traces 118 are not providing a path for thermal energy to travel below the cover 114 and heat the integrated circuit chip 102. If needed or desired, one or more conductive traces 120 could be used on other portions of the structure. Each conductive trace 118 and 120 could be formed from any suitable material(s) and in any suitable manner. As a particular example, each conductive trace 118 and 120 could be formed from copper or other metal(s) or conductive material(s).

Note that the electrical conductors 110 and the conductive traces 118 could be used to transport any suitable signals.

For example, in direct current (DC) circuitry, the electrical conductors 110 and the conductive traces 118 can be used to transport power or DC electrical signals. If the electrical conductors 110 and the conductive traces 118 are used to transport higher-frequency signals, an impedance matching mechanism may be needed. As a particular example, a higher-frequency signal could be transported through a conductive trace 118 implemented as a microstrip, the microstrip can be transitioned to a stripline that travels under the cover 114, and the stripline can be transitioned to another microstrip that feeds the integrated circuit chip 102. In some embodiments, the electrical conductors 110 can be configured to provide a planar interface upon which the thermally-isolating cover 114 can seat.

A cold tip 122 passes through the cover 114 and can physically contact the integrated circuit chip 102 or other component(s) to be cooled. A cooler (such as a cryocooler) can operate to cool the cold tip 122, which then pulls heat out of and cools the integrated circuit chip 102. The cold tip 122 includes any suitable structure that is cooled and that supports heat transfer from one or more components to be cooled. As particular examples, the cold tip 122 could represent a metallic plug or a portion of a cryocooler. Note that while the cold tip 122 is shown here as physically contact the integrated circuit chip 102, this need not be the case. For instance, the cold tip 122 could physically contact the cover 114 without touching the integrated circuit chip 102.

The approach shown in FIG. 1 effectively allows a "replica" of a dewar to be formed around one or more integrated circuit chips or modules to be cooled. A dewar-like volume is created around the chip(s) or module(s) so that heat can be removed from the volume. There may be little or no need to compensate for heat leaking into the volume from the surrounding environment because of the design used here. This approach effectively utilizes a circuit board recess to package a chip or module on a pedestal that is surrounded by high-quality foam insulation or other insulation. This enables the use of a more localized thermal isolation volume surrounding the cooled chip or module using a spatially-focused low size, weight, and power (SWaP) solution. This approach can be repeated for a number of devices to be cooled, such as across multiple channels of an antenna array.

Among other things, this approach encompasses a number of innovative features. These features include the creation of a dewar-like volume around at least one chip or module. These features also include the use of a dewar-like volume having a limited interfacial area where heat from the environment can leak into volume, so a cooling agent may only need to remove the heat dissipated from the chip or module (as well as removing any initial resident heat). These features further include the ability to use standard radio frequency (RF) propagating structures or other signal structures to deliver signals to/from a chip or module and selecting the structure that creates a natural sealing surface to prevent heat from leaking into the volume. In addition, these features include the use of commercial aerogel or other thermal isolation materials and an RF propagating structure, as well as the ability to tailor the dimensions of electrical traces to obtain good impedance matching. Any of these features could be used in any suitable combination in a particular implementation of the arrangement 100.

Depending on the implementation, this approach can achieve one, some, or all of the following advantages. This approach does not require the use of an external dewar to reach cryogenic temperatures or large super-structures to support insulation and cooling. As a result, significant SWaP savings can be achieved compared to conventional approaches. Also, an integrated circuit chip or module can be insulated and cooled to very low temperatures in a very small footprint using components such as aerogel or other insulation and submerged conductors for electrical connections formed from carbon nanotube conductors (which are electrically conductive but thermally insulative at cryogenic temperatures). This approach can make use of typical circuit board processing or fabrication techniques, such as to form the recess, which can help to reduce fabrication costs. Further, this approach can use submerged conductors for electrical connections, which can help to protect the submerged conductors from environmental attack. In addition, this approach can provide a compact packaging architecture so that ample circuit board area remains for other circuit components, such as those that operate at ambient temperatures.

In particular embodiments, various components shown in FIG. 1 could be implemented using a multi-layer printed circuit board (PCB) or custom circuit board (CCB). For example, multi-layer PCBs and CCBs can often be fabricated with pocket recesses, and these recesses may be sufficient to envelop the integrated circuit chip 102 or other component(s) to be cooled. The multi-layer PCBs and CCBs could also be fabricated to include components such as the insulative layer 108 and the electrical conductors 110.

Although FIG. 1 illustrates one example of an arrangement 100 for thermally isolating one or more cryo-cooled components from a circuit board or other structure, various changes may be made to FIG. 1. For example, the relative sizes, shapes, and dimensions of the components in FIG. 1 are for illustration only. Also, the arrangement in FIG. 1 could be replicated any number of times to provide cooling for any number of integrated circuit chips or modules or for other components.

Figure 2:
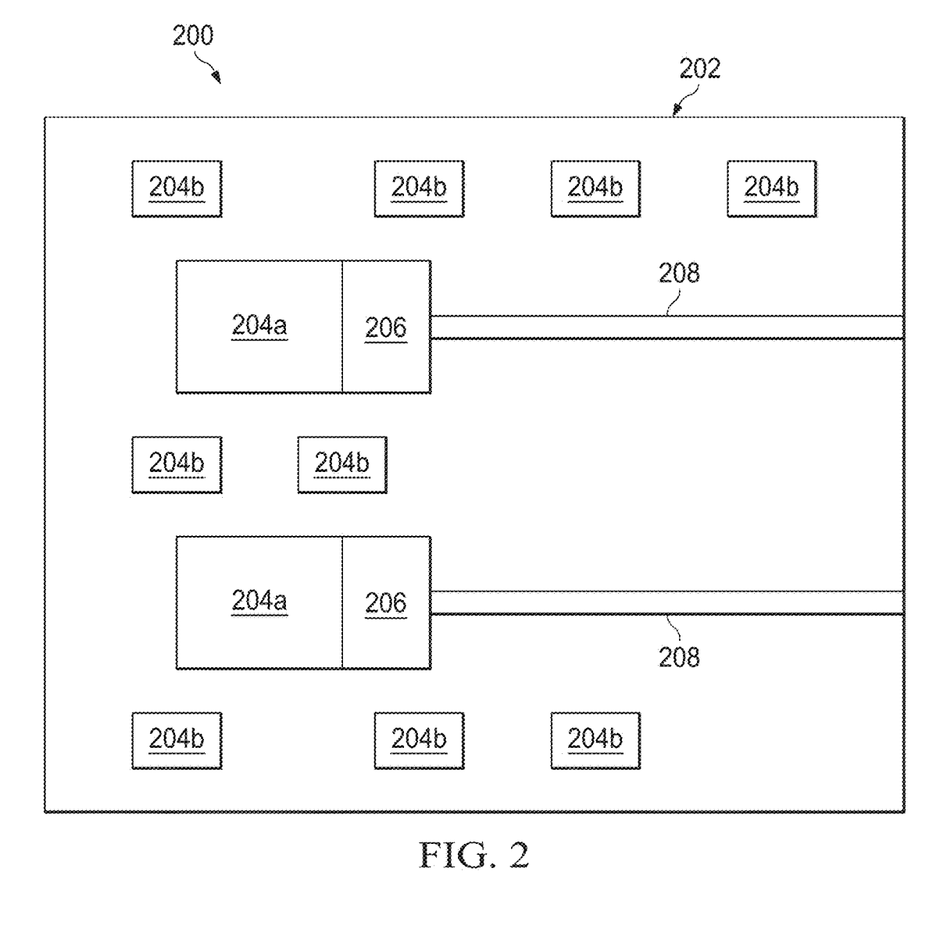
FIGS. 2 and 3 illustrate an example distributed cryocooler architecture for cooling components on one or more circuit boards or other structures according to this disclosure.
Figure 3:
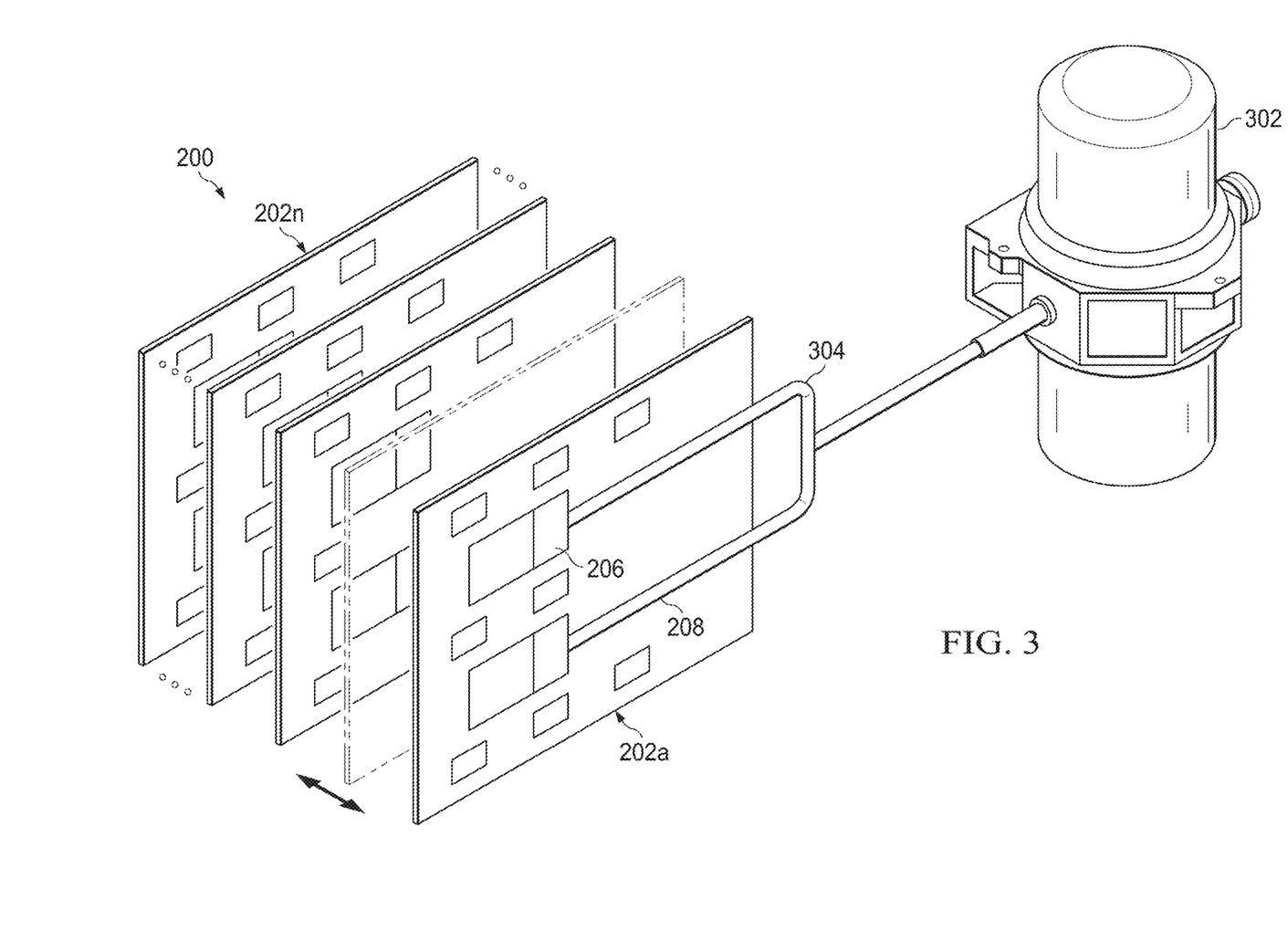

FIGS. 2 and 3 illustrate an example distributed cryocooler architecture 200 for cooling components on one or more circuit boards or other structures according to this disclosure. In the following example, the architecture 200 is described as being used to cool integrated circuit chips or modules on one or more circuit boards. However, the same or similar approach could be used to cool other components.

As shown in FIG. 2, the distributed cryocooler architecture 200 is used in conjunction with a circuit board 202. The circuit board 202 could denote a single-layer or multi-layer PCB or CCB. In this example, the circuit board 202 carries a number of circuit components 204a-204b. Each circuit component 204a-204b denotes any suitable component of one or more electrical circuits. Note that the numbers and arrangements of the circuit components 204a-204b are for illustration only. In this example, the circuit components 204a-204b are divided into circuit components 204a that require cooling and circuit components 204b that do not, although only circuit components 204a that require cooling may be used in other embodiments.

The distributed cryocooler architecture 200 includes multiple cryocooler heat exchangers 206, which are fed through fluid supply/return lines 208. The heat exchangers 206 operate to transfer heat from the areas around the heat exchangers 206 into a fluid traveling back and forth through the supply/return lines 208. For example, the heat exchangers 206 could include expanders that allow compressed gas to enter from the supply/return lines 208 and expand. The expansion of the compressed gas creates a cooling effect, and the gas is then pulled back out of the heat exchangers 206 for recompression.

Each of the heat exchangers 206 includes any suitable structure for exchanging heat with a fluid. As a particular example, each of the heat exchangers 206 could include a regenerator or a recuperator in a Joule-Thomson (JT) cryocooler, a pulse tube cryocooler, a Stirling cryocooler, or a Gifford-McMahon cryocooler. Each supply/return line 208 denotes any suitable passageway for fluid to flow to and from a heat exchanger.

Each of the heat exchangers 206 operates here to cool one or more of the circuit components 204a. For example, the circuit components 204a could be located within cavities that are cooled by the heat exchangers 206. The heat exchangers 206 could also be coupled to cold tips 122 that physically contact and cool the circuit components 204a using the approach shown in FIG. 1.

As shown in FIG. 3, the distributed cryocooler architecture 200 also includes a compressor 302 and a distribution manifold 304. The compressor 302 is configured to compress fluid and to provide the compressed fluid to the heat exchangers 206 via the supply/return lines 208. The compressor 302 includes any suitable structure for compressing a fluid.

The distribution manifold 304 allows the compressed fluid from the compressor 302 to be provided to multiple heat exchangers 206 via the supply/return lines 208. The distribution manifold 304 also allows the fluid to return to the compressor 302 from the heat exchangers 206. The distribution manifold 304 includes any suitable structure for providing fluid from a common source to multiple locations.

As shown in FIG. 3, the distributed cryocooler architecture 200 could be used with multiple circuit boards 202a-202n. This may allow, for example, the compressor 302 and the distribution manifold 304 to be used with an array of transmit/receive modules or other components of an antenna array or other system. Note that while the heat exchangers 206 are shown in FIG. 3 as residing on or within the circuit boards 202a-202n, heat exchangers 206 could also or alternatively reside between the circuit boards 202a-202n.

The distributed cryocooler architecture 200 effectively combines a larger or "macro" compressor 302 with a number of smaller or "micro" cryogenic expanders. Each expander may be used to cool a single electronic component or a small group of electronic components, and cryogenic cooling can be produced locally at each cooled component. The compression required to drive the miniature expanders is distributed throughout the network by the macro-scale compressor.

The use of a single macro-scale compressor reduces the mechanical complexity and drive requirements of the cryogenic system. Also, this approach is particularly suited to arrays of cooled electronics that may be interspersed with other electronic components that operate at room temperatures. This approach therefore allows efficient cryogenic cooling to be provided in a manner that is compact and convenient to integrate.

Although FIGS. 2 and 3 illustrate one example of a distributed cryocooler architecture 200 for cooling components on one or more circuit boards or other structures, various changes may be made to FIGS. 2 and 3. For example, the relative sizes, shapes, and dimensions of the components in FIGS. 2 and 3 are for illustration only. Also, the distributed cryocooler architecture 200 could be used with any number of circuit boards or other structures, and each circuit board or other structure could include any number of cryogenic expanders. In addition, the cooling arrangement here is shown as having the circuit components 204a side-by-side with the heat exchangers 206. However, other arrangements could be used, such as one similar to that shown in FIG. 1 where the heat exchangers 206 are located over the circuit components 204a being cooled.

Figure 4:
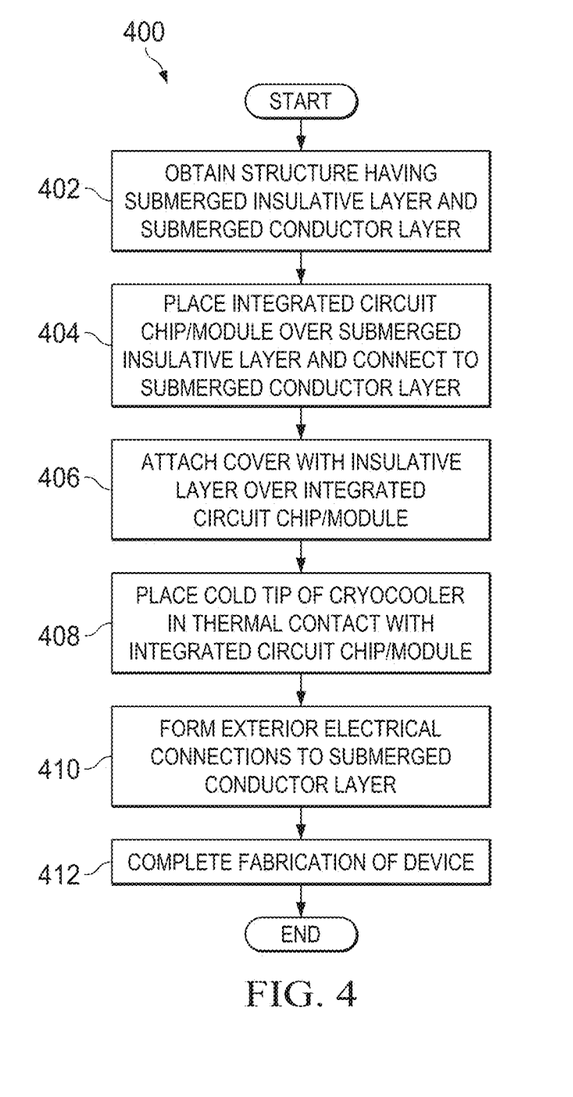
FIG. 4 illustrates an example method for thermally isolating one or more cryo-cooled components from a circuit board or other structure according to this disclosure.

FIG. 4 illustrates an example method 400 for thermally isolating one or more cryo-cooled components from a circuit board or other structure according to this disclosure. For ease of explanation, the method 400 is described with respect to the arrangement 100 shown in FIG. 1. However, the method 400 could be used with any other suitable arrangement of components and in any suitable system.

As shown in FIG. 4, a structure having a submerged insulative layer and a submerged conductor layer is obtained at step 402. This could include, for example, manufacturing, purchasing, or otherwise obtaining a multi-layer PCB or CCB having a recess 106 with an insulative layer 108 and one or more electrical conductors 110 within the recess 106. The insulative layer 108 could be formed using a foam or aerogel insulation, and the electrical conductors 110 could be formed using carbon nanotubes (possibly with ends plated with copper or other metal(s)).

At least one integrated circuit chip or module is placed over the submerged insulative layer and is electrically connected to the submerged conductor layer at step 404. This could include, for example, inserting the integrated circuit chip 102 over the insulative layer 108. This could also include soldering short wires to the integrated circuit chip 102 and the electrical conductors 110 or soldering the integrated circuit chip 102 directly to the electrical conductors 110.

A cover with an insulative layer is attached over the integrated circuit chip or module at step 406. This could include, for example, placing the cover 114 with the insulative layer 116 over the integrated circuit chip 102 and bonding the cover 114 to the underlying structure(s). The insulative layer 116 could be formed using a foam or aerogel insulation. The cover 114 could be attached to the electrical conductors 110, the substrate 104, or other underlying components in any suitable manner.

A cold tip of a cryocooler is placed into thermal contact with the integrated circuit chip or module at step 408. This could include, for example, placing the cold tip 122 through an opening of the cover 114 and sealing the opening. The cold tip 122 could also be formed integral to the cover 114, in which case the cold tip 122 could be placed in thermal contact with the integrated circuit chip 102 when the cover 114 is attached in the prior step.

One or more exterior electrical connections are made to the submerged conductor layer at step 410. This could include, for example, coupling copper or other electrical conductive traces 118 on the substrate 104 to the electrical conductors 110. As a particular example, this could include soldering or otherwise connecting the conductive traces 118 and the electrical conductors 110.

Fabrication of the device is completed at step 412. This could include, for example, performing any other suitable operations to fabricate a device that includes the integrated circuit chip or module. The operations performed here could vary depending on the type of device being fabricated.

Although FIG. 4 illustrates one example of a method 400 for thermally isolating one or more cryo-cooled components from a circuit board or other structure, various changes may be made to FIG. 4. For example, while shown as a series of steps, various steps in FIG. 4 could overlap, occur in parallel, occur in a different order, or occur any number of times. Also, FIG. 4 could be repeated any number of times to form the same or similar structure for multiple components to be cooled.

Figure 5:
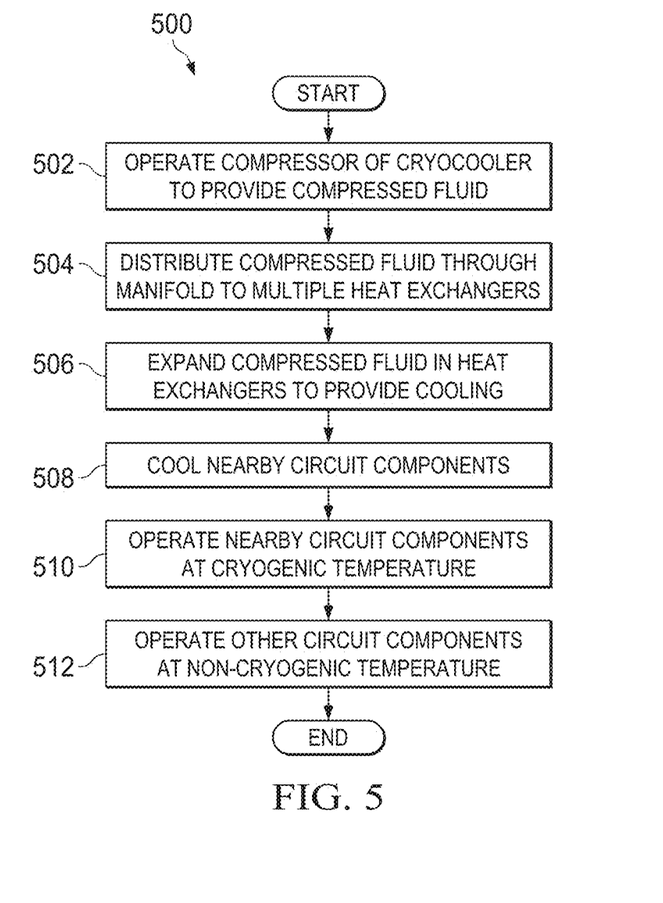
FIG. 5 illustrates an example method for operating a distributed cryocooler architecture for cooling components on one or more circuit boards or other structures according to this disclosure.

FIG. 5 illustrates an example method 500 for operating a distributed cryocooler architecture for cooling components on one or more circuit boards or other structures according to this disclosure. For ease of explanation, the method 500 is described with respect to the distributed cryocooler architecture 200 shown in FIGS. 2 and 3. However, the method 500 could be used with any other suitable arrangement of components and in any suitable system.

As shown in FIG. 5, a cryocooler compressor is operated to provide compressed fluid at step 502. This could include, for example, the compressor 302 operating to compress a gas used in a cryocooler. The compressed fluid is distributed through a manifold to multiple heat exchangers at step 504. This could include, for example, the compressed gas traveling through the distribution manifold 304 to various supply/return lines 208 in various circuit boards 202, 202a-202n.

The compressed fluid expands in the heat exchangers to provide cooling at step 506. This could include, for example, the compressed gas entering into the heat exchangers 206, which could denote cryogenic recuperators or regenerators. The compressed gas expands, which is an isothermal process that absorbs heat.

As a result, nearby circuit components are cooled at step 508. This could include, for example, the heat exchangers 206 operating to cool multiple cold tips 122 that physically contact and cool integrated circuit chips 102 or other components using the approach shown in FIG. 1. This allows the nearby circuit components to operate at cryogenic temperatures at step 510. Optionally, other circuit components (possibly on the same circuit boards) can operate at non-cryogenic temperatures at step 512.

Although FIG. 5 illustrates one example of a method 500 for operating a distributed cryocooler architecture for cooling components on one or more circuit boards or other structures, various changes may be made to FIG. 5. For example, while shown as a series of steps, various steps in FIG. 5 could overlap, occur in parallel, occur in a different order, or occur any number of times.

Note that while the description above has often described the use of both thermally-isolated cryo-cooled components and a distributed cryocooler architecture, each of these approaches could be used separately. For example, thermally-isolated cryo-cooled components could be used without a distributed cryocooler architecture, or a distributed cryocooler architecture could be used without thermally-isolated cryo-cooled components.

It may be advantageous to set forth definitions of certain words and phrases used throughout this patent document. The terms "include" and "comprise," as well as derivatives thereof, mean inclusion without limitation. The term "or" is inclusive, meaning and/or. The phrase "associated with," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, have a relationship to or with, or the like. The phrase "at least one of," when used with a list of items, means that different combinations of one or more of the listed items may be used, and only one item in the list may be needed. For example, "at least one of: A, B, and C" includes any of the following combinations: A, B, C, A and B, A and C, B and C, and A and B and C.

The description in this patent document should not be read as implying that any particular element, step, or function is an essential or critical element that must be included in the claim scope. Also, none of the claims is intended to invoke 35 U.S.C. § 112(f) with respect to any of the appended claims or claim elements unless the exact words "means for" or "step for" are explicitly used in the particular claim, followed by a participle phrase identifying a function. Use of terms such as (but not limited to) "mechanism," "module," "device," "unit," "component," "element," "member," "apparatus," "machine," and "system" within a claim is understood and intended to refer to structures known to those skilled in the relevant art, as further modified or enhanced by the features of the claims themselves, and is not intended to invoke 35 U.S.C. § 112(f).

While this disclosure has described certain embodiments and generally associated methods, alterations and permutations of these embodiments and methods will be apparent to those skilled in the art. Accordingly, the above description of example embodiments does not define or constrain this disclosure. Other changes, substitutions, and alterations are also possible without departing from the scope of this disclosure, as defined by the following claims.

What is claimed is:

1. An apparatus comprising:
   a substantially planar, elongate substrate having a recess in a top surface of the substrate;
   a first thermal insulator submerged in the recess of the substrate;
   a cover comprising sidewalls and a top portion, wherein inside surfaces of the sidewalls and top portion are covered with a second thermal insulator that, together with the first thermal insulator, defines a thermally-insulated volume;
   one or more components to be cooled located over the first thermal insulator and within the thermally-insulated volume;
   one or more electrical conductors electrically connected to at least one of the one or more components, each electrical conductor extending laterally over the first thermal insulator and under one of the sidewalls of the cover such that a first portion of the electrical conductor is located within the thermally-insulated volume and a second portion of the electrical conductor is located outside the thermally-insulated volume, wherein the one or more electrical conductors are thermally-insulative at cryogenic temperatures;
   one or more conductive traces disposed on the top surface of the substrate outside the thermally-insulated volume, the one or more conductive traces electrically connected to the one or more electrical conductors; and
   a dielectric material covering at least the second portion of each electrical conductor that is located outside the thermally-insulated volume and a portion of each conductive trace that is located within the recess.

2. The apparatus of claim 1, wherein the one or more electrical conductors are submerged in the recess of the substrate.

3. The apparatus of claim 1, wherein the one or more electrical conductors comprise carbon nanotubes.

4. The apparatus of claim 1, wherein the one or more conductive traces are impedance matched to the one or more electrical conductors.

5. The apparatus of claim 1, further comprising:
   a cold tip configured to cool the one or more components.

6. The apparatus of claim 5, wherein the cold tip passes through the cover and physically contacts the one or more components.

7. The apparatus of claim 1, wherein the first and second thermal insulators comprise foam or aerogel insulation.

8. A system comprising:
a cryocooler; and
an apparatus comprising:
- a substantially planar, elongate substrate having a recess in a top surface of the substrate;
- a first thermal insulator submerged in the recess of the substrate;
- a cover comprising sidewalls and a top portion, wherein inside surfaces of the sidewalls and top portion are covered with a second thermal insulator that, together with the first thermal insulator, defines a thermally-insulated volume;
- one or more components to be cooled by the cryocooler, the one or more components located over the first thermal insulator and within the thermally-insulated volume;
- one or more electrical conductors electrically connected to at least one of the one or more components, each electrical conductor extending laterally over the first thermal insulator and under an outer edge one of the sidewalls of the cover such that a first portion of the electrical conductor is located within the thermally-insulated volume and a second portion of the electrical conductor is located outside the thermally-insulated volume, wherein the one or more electrical conductors are thermally-insulative at cryogenic temperatures;
- one or more conductive traces disposed on the top surface of the substrate outside the thermally-insulated volume, the one or more conductive traces electrically connected to the one or more electrical conductors; and
- a dielectric material covering at least the second portion of each electrical conductor that is located outside the thermally-insulated volume and a portion of each conductive trace that is located within the recess.

9. The system of claim 8, wherein the one or more electrical conductors are submerged in the recess of the substrate.

10. The system of claim 8, wherein:
the one or more electrical conductors comprise carbon nanotubes; and
the first and second thermal insulators comprise foam or aerogel insulation.

11. The system of claim 8, wherein:
the cryocooler has a distributed architecture comprising a compressor and multiple expanders coupled by fluid supply/return lines; and
at least one of the expanders is positioned on or proximate the substrate.

12. The system of claim 11, wherein:
the apparatus comprises multiple substrates;
at least one of the expanders is positioned on or proximate each of the substrates; and
the cryocooler further comprises a distribution manifold configured to provide compressed fluid from the compressor to the expanders.

13. The system of claim 8, wherein the apparatus further comprises one or more additional electrical components that are not cooled by the cryocooler, the one or more additional electrical components carried by the substrate and located outside the thermally-insulated volume.

14. The system of claim 8, further comprising:
a cold tip configured to be cooled by the cryocooler and to cool the one or more components.

15. A method comprising:
obtaining a substantially planar, elongate substrate having a recess in a top surface of the substrate and a first thermal insulator submerged in the recess of the substrate;
placing one or more components to be cooled over the first thermal insulator; and
placing a cover comprising sidewalls and a top portion over the one or more components, wherein inside surfaces of the sidewalls and top portion are covered with a second thermal insulator that, together with the first thermal insulator, define a thermally-insulated volume in which the one or more components are located;
wherein at least one of the one or more components electrically contacts one or more electrical conductors, each electrical conductor extending laterally over the first thermal insulator and under one of the sidewalls of the cover such that a first portion of the electrical conductor is located within the thermally-insulated volume and a second portion of the electrical conductor is located outside the thermally-insulated volume, wherein the one or more electrical conductors are thermally-insulative at cryogenic temperatures,
wherein one or more conductive traces disposed on the top surface of the substrate outside the thermally-insulated volume are electrically connected to the one or more electrical conductors, and
wherein a dielectric material covers at least the second portion of each electrical conductor that is located outside the thermally-insulated volume and a portion of each conductive trace that is located within the recess.

16. The method of claim 15, wherein the one or more electrical conductors are submerged in the recess of the substrate and located over the first thermal insulator.

17. The method of claim 15, further comprising:
thermally coupling a cold tip to the one or more components.

18. The method of claim 15, further comprising:
placing an expander of a cryocooler on or proximate the substrate, the expander configured to cool the one or more components.

19. The method of claim 18, wherein the cryocooler has a distributed architecture comprising a compressor and multiple expanders coupled by fluid supply/return lines.

20. The apparatus of claim 1, wherein the one or more components, the cover, and the first and second portions of each electrical conductor are positioned completely above the first thermal insulator.

* * * * *

UNITED STATES PATENT AND TRADEMARK OFFICE
CERTIFICATE OF CORRECTION

| | | |
|---|---|---|
| PATENT NO. | : 10,390,455 B2 | Page 1 of 1 |
| APPLICATION NO. | : 15/470315 | |
| DATED | : August 20, 2019 | |
| INVENTOR(S) | : James R. Chow et al. | |

It is certified that error appears in the above-identified patent and that said Letters Patent is hereby corrected as shown below:

In the Claims

In Claim 8, Column 11, Line 20, "under an outer edge one" should be changed to --under one--.

Signed and Sealed this
Fourteenth Day of June, 2022

Katherine Kelly Vidal
*Director of the United States Patent and Trademark Office*